United States Patent
Mead

(10) Patent No.: US 7,975,200 B2
(45) Date of Patent: Jul. 5, 2011

(54) ERROR CORRECTION CODE (ECC) DECODING ARCHITECTURE DESIGN USING SYNTHESIS-TIME DESIGN PARAMETERS

(75) Inventor: John P. Mead, Longmont, CO (US)

(73) Assignee: Broadcom Corporation, Irvine, CA (US)

( * ) Notice: Subject to any disclaimer, the term of this patent is extended or adjusted under 35 U.S.C. 154(b) by 991 days.

(21) Appl. No.: 11/840,606

(22) Filed: Aug. 17, 2007

(65) Prior Publication Data
US 2008/0270961 A1 Oct. 30, 2008

Related U.S. Application Data

(60) Provisional application No. 60/926,906, filed on Apr. 30, 2007.

(51) Int. Cl.
*H03M 13/00* (2006.01)
(52) U.S. Cl. .......................... 714/752; 714/755; 714/758
(58) Field of Classification Search .................. 714/752, 714/755, 758
See application file for complete search history.

(56) References Cited

U.S. PATENT DOCUMENTS 6,654,916 B1* 11/2003 Furukawa ..................... 714/724
2009/0177943 A1* 7/2009 Silvus et al. .................. 714/755

* cited by examiner

*Primary Examiner* — Sam Rizk
(74) *Attorney, Agent, or Firm* — Garlick Harrison & Markison; Shayne X. Short

(57) ABSTRACT

Error correction code (ECC) decoding architecture design using synthesis-time design parameters. An approach is presented herein by which an ECC decoding architecture can be designed using synthesis-time design parameters. The manner presented herein allows for a designer to arrive at an ECC decoding architecture in a more direct, straightforward manner that using prior art means. A number of considerations (e.g., architecture parameters, semi-soft design constraints, parallel implementation, etc.) are initially provided; certain or all of these considerations can be predetermined, determined adaptively, and/or modified during the design process. A designer is provided a means by which a most desirable ECC decoding architecture can be arrived at relatively quickly.

20 Claims, 13 Drawing Sheets

ERROR CORRECTION CODE (ECC) DECODING ARCHITECTURE DESIGN USING SYNTHESIS-TIME DESIGN PARAMETERS

CROSS REFERENCE TO RELATED PATENTS/PATENT APPLICATIONS

Provisional Priority Claims

The present U.S. Utility patent application claims priority pursuant to 35 U.S.C. §119(e) to the following U.S. Provisional Patent Application which is hereby incorporated herein by reference in its entirety and made part of the present U.S. Utility patent application for all purposes:

1. U.S. Provisional Application Ser. No. 60/926,906, entitled "Error correction code (ECC) decoding architecture design using synthesis-time design parameters," filed Apr. 30, 2007, pending.

BACKGROUND OF THE INVENTION

1. Technical Field of the Invention

The invention relates generally to devices that include a hard disk drive (HDD); and, more particularly, it relates to management of the various functions that are performed within such devices that include a HDD.

2. Description of Related Art

As is known, many varieties of memory storage devices (e.g., disk drives/HDDs), such as magnetic disk drives are used to provide data storage for a host device, either directly, or through a network such as a storage area network (SAN) or network attached storage (NAS). Typical host devices include stand alone computer systems such as a desktop or laptop computer, enterprise storage devices such as servers, storage arrays such as a redundant array of independent disks (RAID) arrays, storage routers, storage switches and storage directors, and other consumer devices such as video game systems and digital video recorders. These devices provide high storage capacity in a cost effective manner.

When designing devices that include a HDD, there are many considerations to make and oftentimes many cost/benefit/trade-offs that are made to arrive at a final solution. The prior art approaches to making and designing such systems that may include an HDD are typically performed in an ad hoc way, in that, a designer generally considers the overall design and attempts to come up with (ideally) a best overall design. These systems oftentimes include some form of error correction code (ECC) decoding functionality as well, and the design of such ECC decoding functionality can oftentimes be one of the more challenging portions of overall design. In the prior art, there is no general means by which the design of such ECC decoding architectures can be made, including those implemented within devices and systems that include one or more HDDs.

BRIEF SUMMARY OF THE INVENTION

The present invention is directed to apparatus and methods of operation that are further described in the following Brief Description of the Several Views of the Drawings, the Detailed Description of the Invention, and the claims. Other features and advantages of the present invention will become apparent from the following detailed description of the invention made with reference to the accompanying drawings.

DETAILED DESCRIPTION OF THE INVENTION

Figure 1:
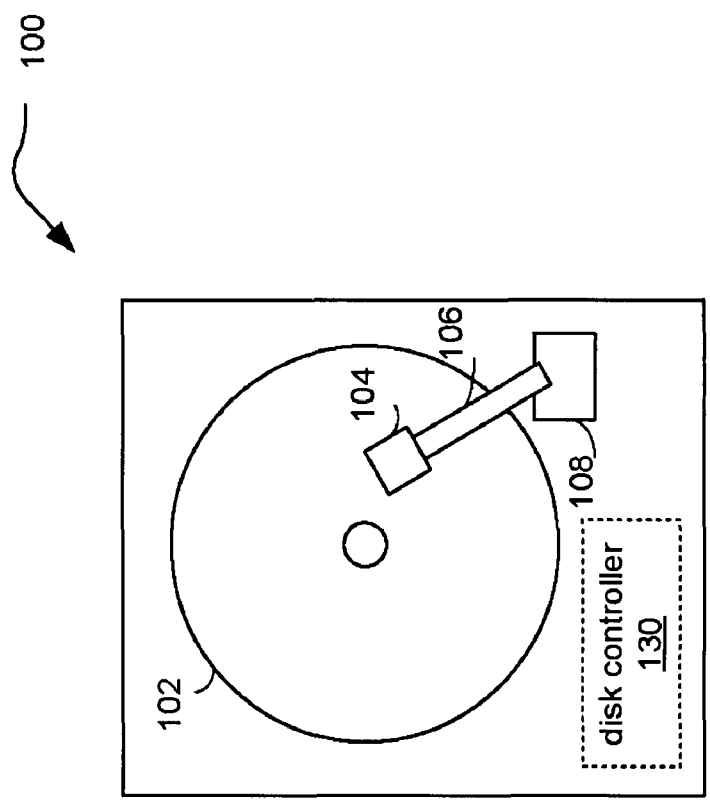
FIG. 1 illustrates an embodiment of a disk drive unit.

A novel approach is presented herein by which an ECC decoding architecture can be designed using synthesis-time design parameters. These synthesis-time design parameters include parameters employed to design the ECC decoding architecture, and they are parameters which are adjusted and modified during the designing of the ECC decoding architecture. Once a final ECC decoding architecture has been converged upon (or decided upon), then these synthesis-time design parameters can then be viewed as 'hard' parameters which govern the actual size or area, number of gates, processing, speed, power consumption, etc. of the final ECC decoding architecture that can be implemented in hardware within a device and/or communication device.

The manner presented herein allows for a designer to arrive at an ECC decoding architecture in a more direct, straightforward manner that using prior art means. A number of considerations (e.g., architecture parameters, semi-soft design constraints, parallel implementation, etc.) are initially provided; certain or all of these considerations can be predetermined, determined adaptively, and/or modified during the design process. A designer is provided a means by which a most desirable ECC decoding architecture can be arrived at relatively quickly.

Generally speaking, it is very difficult to determine the best architectural tradeoffs for a set of ECC design constraints prior to starting a design. Even when this task can be accomplished to a sufficient degree (which is not oftentimes possible), the overall design cannot otherwise be fine tuned at the last minute without. Moreover, there is an inherent amount of risk in making architectural design changes later on in the overall design process. For example, state machines and other logic must be changed when doing so, and mistakes can easily be made then. There is substantial effort (e.g., design time, effort, cost, etc.) required to perform any architectural changes in order to meet changing ECC requirements. A substantial amount of time (schedule) is also required to perform architectural changes in order to meet changing ECC requirements.

This novel design approach introduces the use of a variety of ECC architectural design parameters that are elaborated during design synthesis to accomplish a finely tuned ECC architecture. In addition, in some embodiments, a spreadsheet or computer program can be used as analysis tool (e.g., which can be a method, processing module, and/or combo thereof in certain embodiments) to help make tradeoff decisions on design parameter settings. For certain desired embodiments, some of the design requirements for each are listed below:

ECC Design Requirements

The ECC decoder clock should be independent and run at a higher frequency than the channel's symbol read transfer clock.

The design should be made parametric with various synthesis-time parameters in the design to select Galois field ALU parallelism, Chien search parallelism, value computer (divider) parallelism, maximum FCC correction power, etc.

The ECC Galois field math should be made dependant on ECC parameters that include the ECC symbol width, and the primitive polynomial of the Galois field.

Analysis Tool Requirements

The analysis tool must compute the worst-case minimum time between adjacent sectors based on disk drive format overhead variables and a channel data rate variable.

The analysis tool must compute the worst-case maximum ECC on-the-fly correction time based on the above mentioned design parameter settings.

The analysis tool should be able to estimate silicon area consumption (in gates) based on the above mentioned design parameter settings and the ASIC technology being used.

The novel design means presented herein allows the designer to make last-minute tradeoffs between silicon area consumption, FCC performance requirements, maximum system clock frequencies, power consumption, etc. Many benefits are provided by this novel design approach. Though this list is not exhaustive, some of the benefits include (1) ASIC cost and power savings due to efficient silicon area consumption, (2) risk mitigation for design modifications (e.g., the design doesn't change only the parameters) and (3) there is minimal schedule impact due to quick turn-around time for parameterized design modifications, etc.

FIG. 1 illustrates an embodiment of a disk drive unit 100. In particular, disk drive unit 100 includes a disk 102 that is rotated by a servo motor (not specifically shown) at a velocity such as 3600 revolutions per minute (RPM), 4200 RPM, 4800 RPM, 5,400 RPM, 7,200 RPM, 10,000 RPM, 15,000 RPM; however, other velocities including greater or lesser velocities may likewise be used, depending on the particular application and implementation in a host device. In one possible embodiment, disk 102 can be a magnetic disk that stores information as magnetic field changes on some type of magnetic medium. The medium can be a rigid or non-rigid, removable or non-removable, that consists of or is coated with magnetic material.

Disk drive unit 100 further includes one or more read/write heads 104 that are coupled to arm 106 that is moved by actuator 108 over the surface of the disk 102 either by translation, rotation or both. A disk controller 130 is included for controlling the read and write operations to and from the drive, for controlling the speed of the servo motor and the motion of actuator 108, and for providing an interface to and from the host device.

Figure 2:
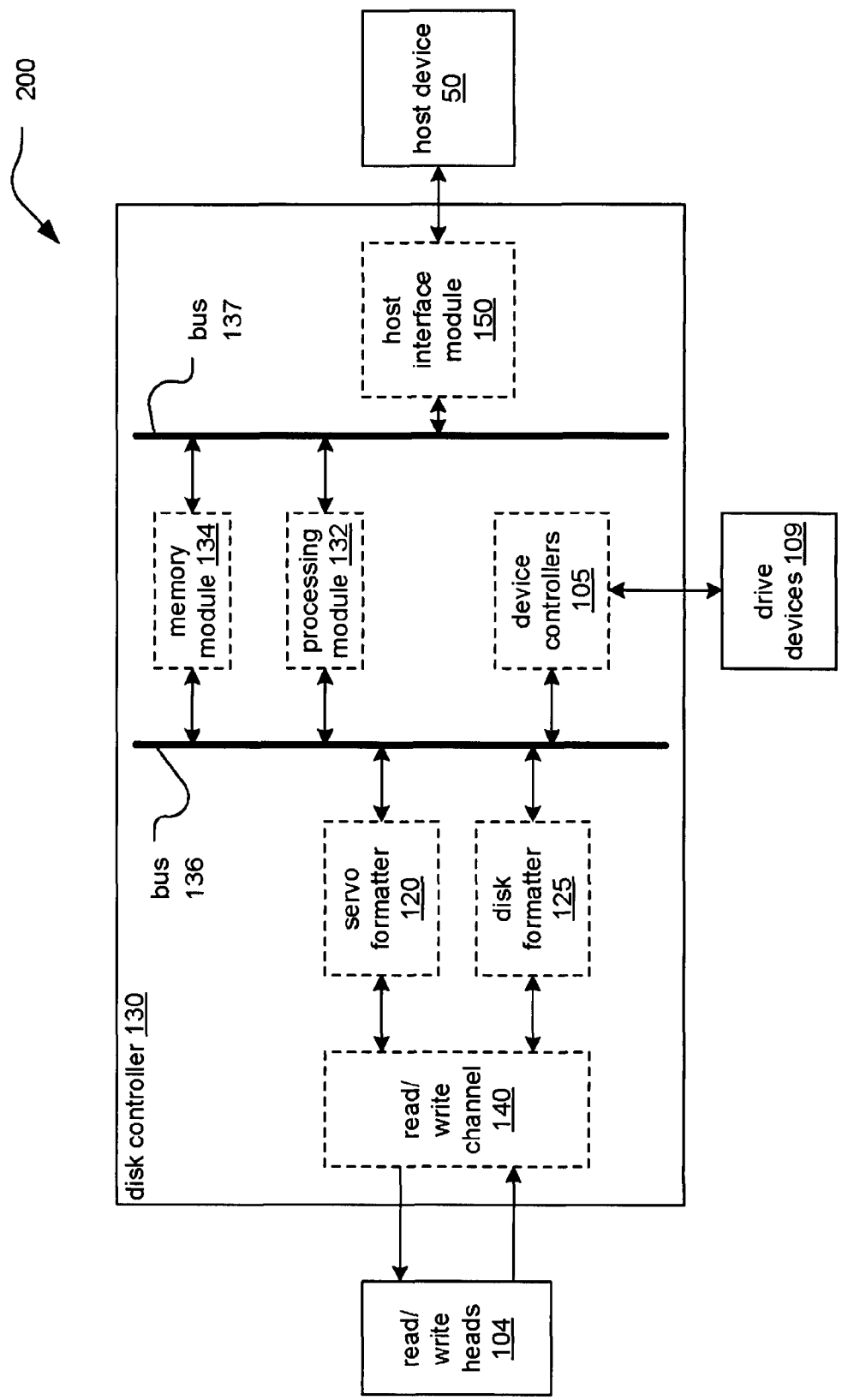
FIG. 2 illustrates an embodiment of an apparatus that includes a disk controller.

FIG. 2 illustrates an embodiment of an apparatus 200 that includes a disk controller 130. In particular, disk controller 130 includes a read/write channel 140 for reading and writing data to and from disk 102 through read/write heads 104. Disk formatter 125 is included for controlling the formatting of data and provides clock signals and other timing signals that control the flow of the data written to, and data read from disk 102. Servo formatter 120 provides clock signals and other timing signals based on servo control data read from disk 102. Device controllers 105 control the operation of drive devices 109 such as actuator 108 and the servo motor, etc. Host interface 150 receives read and write commands from host device 50 and transmits data read from disk 102 along with other control information in accordance with a host interface protocol. In one embodiment, the host interface protocol can include, SCSI, SATA, enhanced integrated drive electronics (EIDE), or any number of other host interface protocols, either open or proprietary that can be used for this purpose.

Disk controller 130 further includes a processing module 132 and memory module 134. Processing module 132 can be implemented using one or more microprocessors, micro-controllers, digital signal processors, microcomputers, central processing units, field programmable gate arrays, programmable logic devices, state machines, logic circuits, analog circuits, digital circuits, and/or any devices that manipulates signal (analog and/or digital) based on operational instructions that are stored in memory module 134. When processing module 132 is implemented with two or more devices, each device can perform the same steps, processes or functions in order to provide fault tolerance or redundancy. Alternatively, the function, steps and processes performed by processing module 132 can be split between different devices to provide greater computational speed and/or efficiency.

Memory module 134 may be a single memory device or a plurality of memory devices. Such a memory device may be a read-only memory, random access memory, volatile memory, non-volatile memory, static random access memory (SRAM), dynamic random access memory (DRAM), flash memory, cache memory, and/or any device that stores digital information. Note that when the processing module 132 implements one or more of its functions via a state machine, analog circuitry, digital circuitry, and/or logic circuitry, the memory module 134 storing the corresponding operational instructions may be embedded within, or external to, the circuitry comprising the state machine, analog circuitry, digital circuitry, and/or logic circuitry. Further note that, the memory module 134 stores, and the processing module 132 executes, operational instructions that can correspond to one or more of the steps or a process, method and/or function illustrated herein.

Disk controller 130 includes a plurality of modules, in particular, device controllers 105, processing module 132, memory module 134, read/write channel 140, disk formatter 125, and servo formatter 120 that are interconnected via bus 136 and bus 137. The host interface 150 can be connected to only the bus 137 and communicates with the host device 50.

Each of these modules can be implemented in hardware, firmware, software or a combination thereof, in accordance with the broad scope of the present invention. While a particular bus architecture is shown in FIG. 2 with buses 136 and 137, alternative bus architectures that include either a single bus configuration or additional data buses, further connectivity, such as direct connectivity between the various modules, are likewise possible to implement the features and functions included in various embodiments.

In one possible embodiment, one or more modules of disk controller 130 are implemented as part of a system on a chip (SoC) integrated circuit. In an embodiment, this SoC integrated circuit includes a digital portion that can include additional modules such as protocol converters, linear block code encoding and decoding modules, etc., and an analog portion that includes device controllers 105 and optionally additional modules, such as a power supply, etc. In a further embodiment, the various functions and features of disk controller 130 are implemented in a plurality of integrated circuit devices that communicate and combine to perform the functionality of disk controller 130.

When the drive unit 100 is manufactured, disk formatter 125 writes a plurality of servo wedges along with a corresponding plurality of servo address marks at equal radial distance along the disk 102. The servo address marks are used by the timing generator for triggering the "start time" for various events employed when accessing the media of the disk 102 through read/write heads 104.

Figure 3:
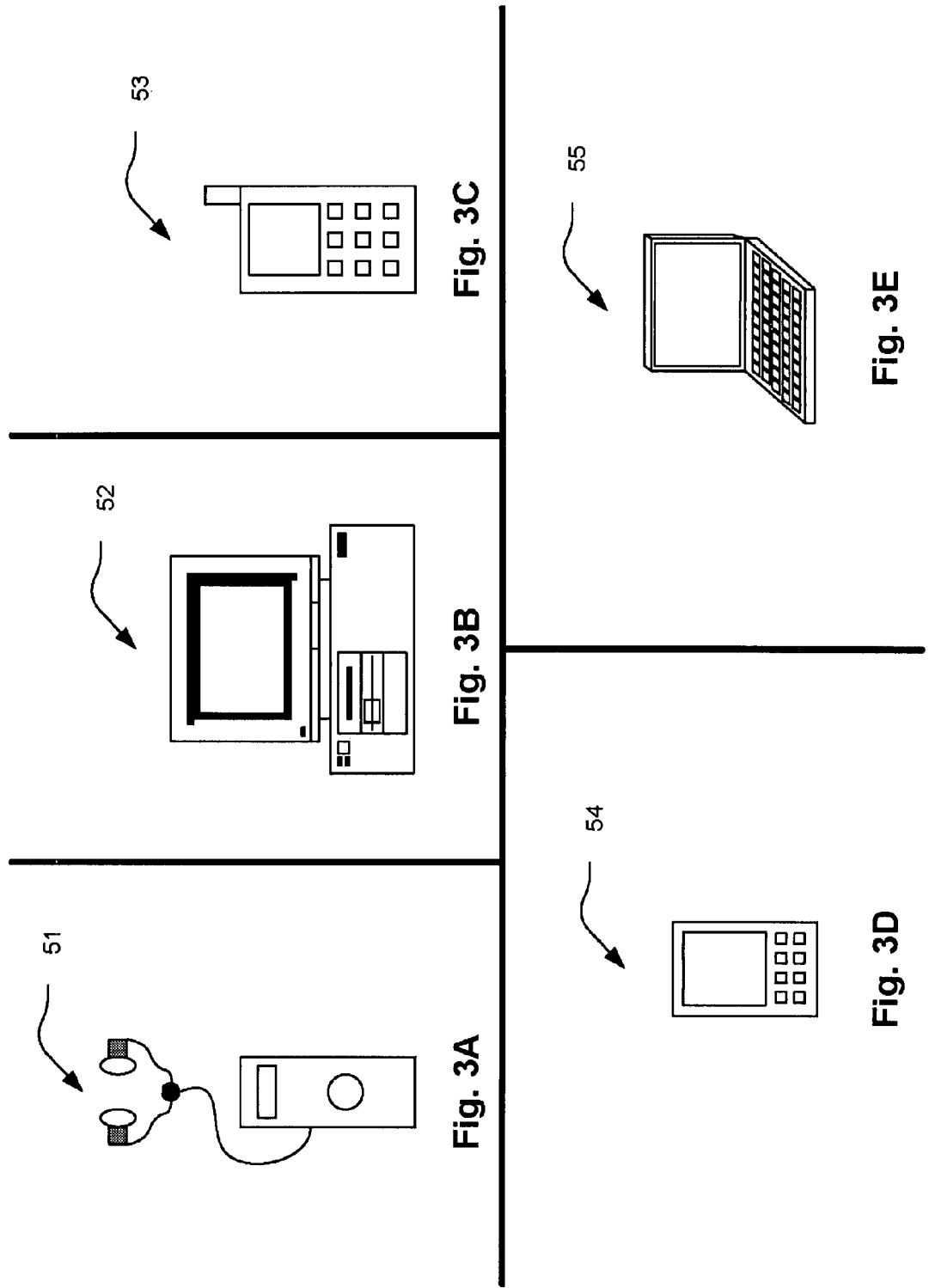
FIG. 3A illustrates an embodiment of a handheld audio unit.
FIG. 3B illustrates an embodiment of a computer.
FIG. 3C illustrates an embodiment of a wireless communication device.
FIG. 3D illustrates an embodiment of a personal digital assistant (PDA).
FIG. 3E illustrates an embodiment of a laptop computer.

FIG. 3A illustrates an embodiment of a handheld audio unit 51. In particular, disk drive unit 100 can be implemented in the handheld audio unit 51. In one possible embodiment, the disk drive unit 100 can include a small form factor magnetic hard disk whose disk 102 has a diameter 1.8" or smaller that is incorporated into or otherwise used by handheld audio unit 51 to provide general storage or storage of audio content such as motion picture expert group (MPEG) audio layer 3 (MP3) files or Windows Media Architecture (WMA) files, video content such as MPEG4 files for playback to a user, and/or any other type of information that may be stored in a digital format.

FIG. 3B illustrates an embodiment of a computer 52. In particular, disk drive unit 100 can be implemented in the computer 52. In one possible embodiment, disk drive unit 100 can include a small form factor magnetic hard disk whose disk 102 has a diameter 1.8" or smaller, a 2.5" or 3.5" drive or larger drive for applications such as enterprise storage applications. Disk drive 100 is incorporated into or otherwise used by computer 52 to provide general purpose storage for any type of information in digital format. Computer 52 can be a desktop computer, or an enterprise storage devices such a server, of a host computer that is attached to a storage array such as a redundant array of independent disks (RAID) array, storage router, edge router, storage switch and/or storage director.

FIG. 3C illustrates an embodiment of a wireless communication device 53. In particular, disk drive unit 100 can be implemented in the wireless communication device 53. In one possible embodiment, disk drive unit 100 can include a small form factor magnetic hard disk whose disk 102 has a diameter 1.8" or smaller that is incorporated into or otherwise used by wireless communication device 53 to provide general storage or storage of audio content such as motion picture expert group (MPEG) audio layer 3 (MP3) files or Windows Media Architecture (WMA) files, video content such as MPEG4 files, JPEG (joint photographic expert group) files, bitmap files and files stored in other graphics formats that may be captured by an integrated camera or downloaded to the wireless communication device 53, emails, webpage information and other information downloaded from the Internet, address book information, and/or any other type of information that may be stored in a digital format.

In a possible embodiment, wireless communication device 53 is capable of communicating via a wireless telephone network such as a cellular, personal communications service (PCS), general packet radio service (GPRS), global system for mobile communications (GSM), and integrated digital enhanced network (iDEN) or other wireless communications network capable of sending and receiving telephone calls. Further, wireless communication device 53 is capable of communicating via the Internet to access email, download content, access websites, and provide steaming audio and/or video programming. In this fashion, wireless communication device 53 can place and receive telephone calls, text messages such as emails, short message service (SMS) messages, pages and other data messages that can include attachments such as documents, audio files, video files, images and other graphics.

FIG. 3D illustrates an embodiment of a personal digital assistant (PDA) 54. In particular, disk drive unit 100 can be implemented in the personal digital assistant (PDA) 54. In one possible embodiment, disk drive unit 100 can include a small form factor magnetic hard disk whose disk 102 has a diameter 1.8" or smaller that is incorporated into or otherwise used by personal digital assistant 54 to provide general storage or storage of audio content such as motion picture expert group (MPEG) audio layer 3 (MP3) files or Windows Media Architecture (WMA) files, video content such as MPEG4 files, JPEG (joint photographic expert group) files, bitmap files and files stored in other graphics formats, emails, webpage information and other information downloaded from the Internet, address book information, and/or any other type of information that may be stored in a digital format.

FIG. 3E illustrates an embodiment of a laptop computer 55. In particular, disk drive unit 100 can be implemented in the laptop computer 55. In one possible embodiment, disk drive unit 100 can include a small form factor magnetic hard disk whose disk 102 has a diameter 1.8" or smaller, or a 2.5" drive. Disk drive 100 is incorporated into or otherwise used by laptop computer 52 to provide general purpose storage for any type of information in digital format.

Figure 4:
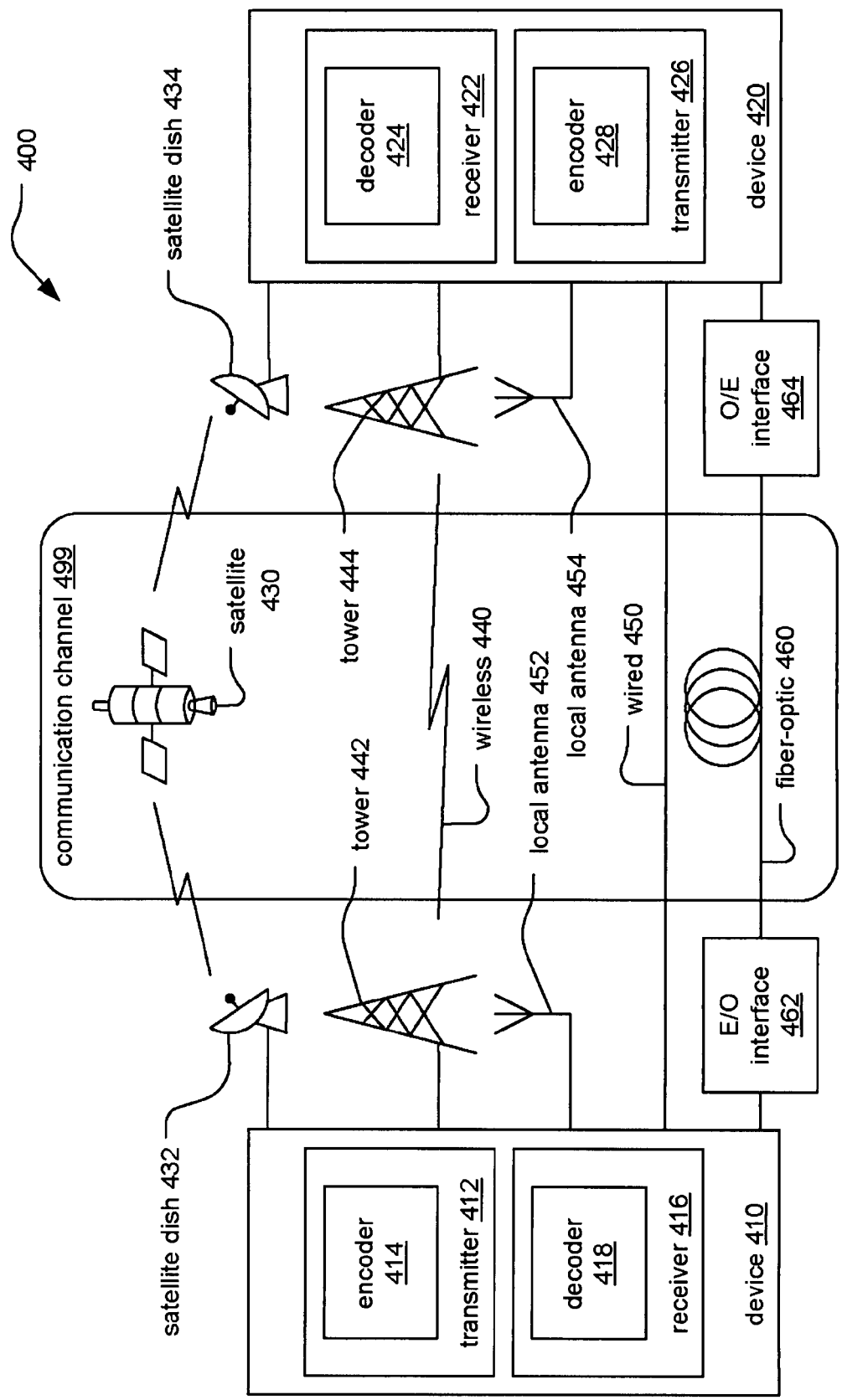
FIG. 4 illustrates an embodiment of a communication system.

FIG. 4 is a diagram illustrating an embodiment of a communication system 400.

Referring to FIG. 4, this embodiment of a communication system 400 is a communication channel 499 that communicatively couples a communication device 410 (including a transmitter 412 having an encoder 414 and including a receiver 416 having a decoder 418) situated at one end of the communication channel 499 to another communication device 420 (including a transmitter 426 having an encoder 428 and including a receiver 422 having a decoder 424) at the other end of the communication channel 499. In some embodiments, either of the communication devices 410 and 420 may only include a transmitter or a receiver. There are several different types of media by which the communication channel 499 may be implemented (e.g., a satellite communication channel 430 using satellite dishes 432 and 434, a wireless communication channel 440 using towers 442 and 444 and/or local antennae 452 and 454, a wired communication channel 450, and/or a fiber-optic communication channel 460 using electrical to optical (E/O) interface 462 and optical to electrical (O/E) interface 464)). In addition, more than one type of media may be implemented and interfaced together thereby forming the communication channel 499.

The signals employed within this embodiment of a communication system 400 can be Reed-Solomon (RS) coded signals, LDPC (Low Density Parity Check) coded signal, turbo coded signals, turbo trellis coded modulation (TTCM), or coded signal generated using some other error correction code (ECC). Any of a very wide variety of applications that employ ECC coding can benefit from various aspects of the invention, including any of those types of communication systems depicted in FIG. 4. Moreover, other types of devices and applications that employ ECC coding (e.g., including those employing some type of HDD or other memory storage means) can also benefit from various aspects of the invention.

Figure 5:
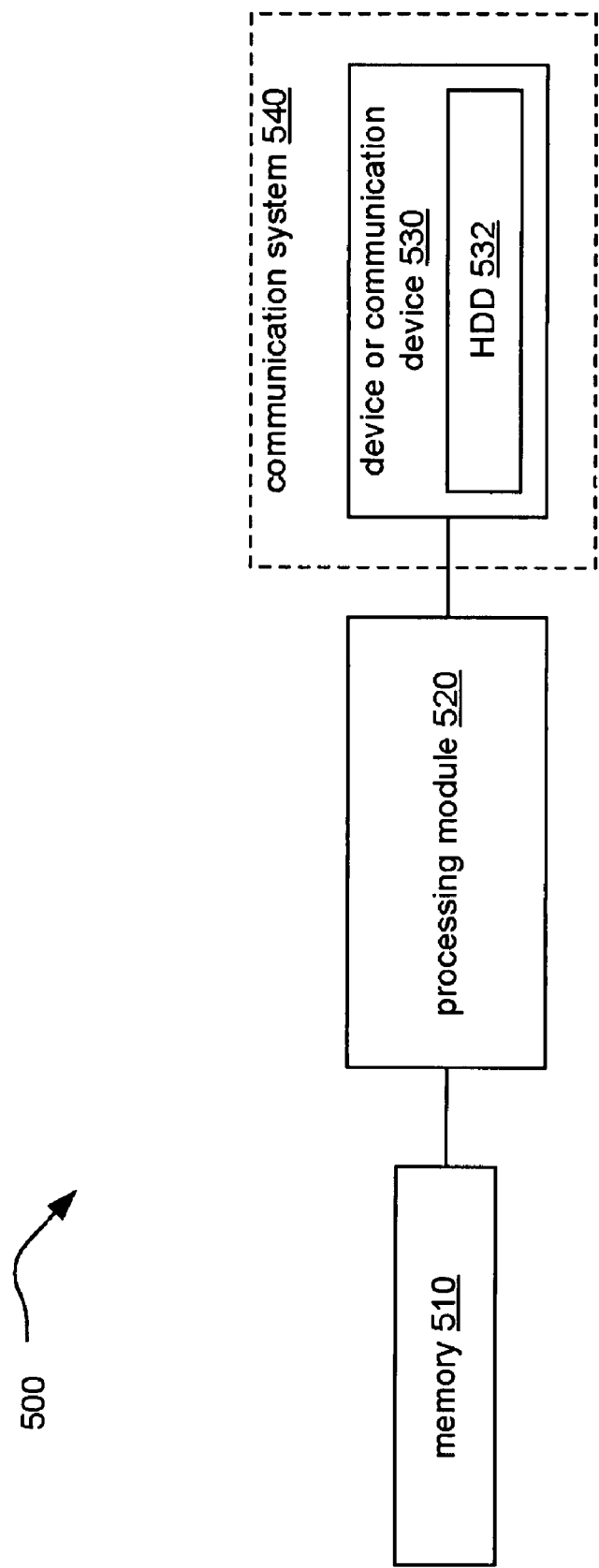
FIG. 5 illustrates an embodiment of an apparatus that is operable to design an error correction code (ECC) decoding architecture using synthesis-time design parameters.

FIG. 5 illustrates an embodiment of an apparatus 500 that is operable to design an error correction code (ECC) decoding architecture using synthesis-time design parameters. The apparatus 500 includes a processing module 520, and a memory 510. The memory 510 is coupled to the processing module, and the memory 510 is operable to store operational instructions that enable the processing module 520 to perform a variety of functions. The processing module 520 is operable to perform the appropriate processing to arrive at and/or assist in the design of an ECC decoding architecture based on one or more architecture parameters using any of the approaches presented herein.

The processing module 520 can be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 510 may be a single memory device or a plurality of memory devices. Such a memory device may be a read-only memory, random access memory, volatile memory, non-volatile memory, static memory, dynamic memory, flash memory, and/or any device that stores digital information. Note that when the processing module 520 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

If desired in some embodiments, the ECC decoding architecture can be provided from the apparatus 500 to a communication system 540 that is operable to employ and perform error correcting coding using that ECC decoding architecture. The parity check matrix of the LDPC code can also be provided from the apparatus 500 to any of a variety of devices or communication devices 530 implemented within the communication system 540 as well. The device or communication device 530 can include a HDD 532 in certain embodiments. This way, a completely integrated means is provided by which the FCC decoding architecture can be constructed and provided to and implemented as part of a device or communication device that employs that ECC decoding architecture. If desired, the apparatus 520 can be designed to generate multiple FCC decoding architectures corresponding to multiple needs and/or desired as well. In some embodiments, the apparatus 520 can selectively provide different information (corresponding to different FCC decoding architecture) to different communication devices and/or communication systems. That way, different communication links between different communication devices can employ different error correcting coding. Clearly, the apparatus 520 can also provide the same information (corresponding to a singular FCC decoding architecture) to each of different communication devices and/or communication systems as well without departing from the scope and spirit of the invention.

Figure 6:
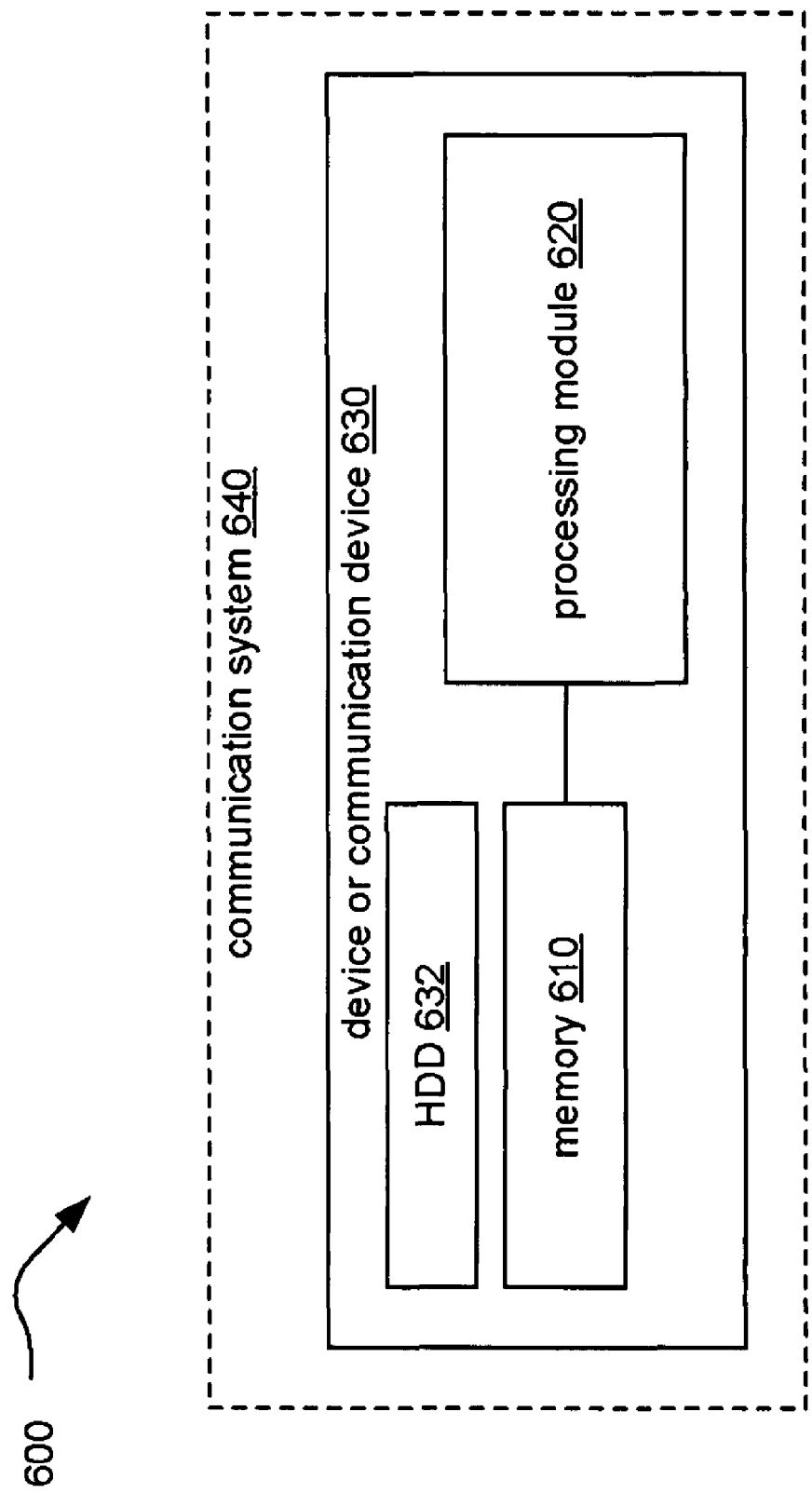
FIG. 6 illustrates an alternative embodiment of an apparatus that is operable to design an ECC decoding architecture using synthesis-time design parameters.

FIG. 6 illustrates an alternative embodiment of an apparatus 600 that is operable to design an error correction code (FCC) decoding architecture using synthesis-time design parameters. The apparatus 600 includes a processing module 620, and a memory 610. The memory 610 is coupled to the processing module, and the memory 610 is operable to store operational instructions that enable the processing module 620 to perform a variety of functions. The processing module 620 (serviced by the memory 610) can be implemented as an apparatus capable to perform any of the functionality of any of the various modules and/or functional blocks described herein. For example, the processing module 620 (serviced by the memory 620) can be implemented as an apparatus capable to perform LDPC code construction and processing of an LDPC coded signal using any of the various embodiments described herein. The processing module 620 is operable to perform the appropriate processing to generate at least one LDPC matrix corresponding to at least one LDPC code using any of the approach presented herein.

The processing module 620 can be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 610 may be a single memory device or a plurality of memory devices. Such a memory device may be a read-only memory, random access memory, volatile memory, non-volatile memory, static memory, dynamic memory, flash memory, and/or any device that stores digital information. Note that when the processing module 620 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

If desired in some embodiments, the apparatus 600 can be any of a variety of devices or communication devices 630, or any part or portion of any such device or communication device 630. The device or communication device 630 can include a HDD 632 in certain embodiments. Any such communication device that includes the apparatus 600 can be implemented within any of a variety of communication systems 640 as well. It is also noted that various embodiments of design of ECC decoding architecture presented herein, and equivalents thereof, may be applied to many types of communication systems and/or communication devices.

Figure 7:
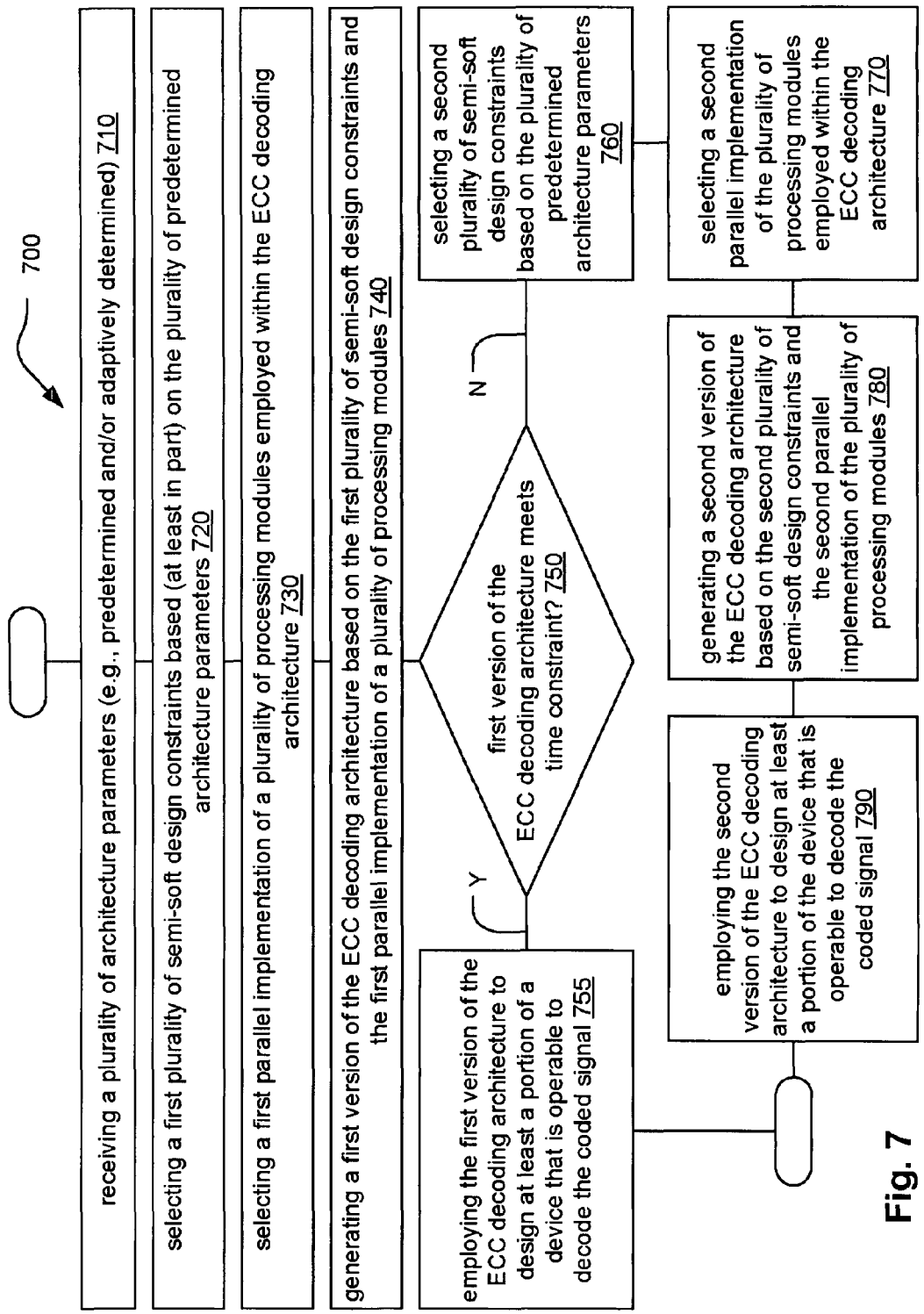
FIG. 7 illustrates an embodiment of a method for designing an ECC decoding architecture using synthesis-time design parameters.

FIG. 7 illustrates an embodiment of a method 700 for designing an error correction code (ECC) decoding architecture using synthesis-time design parameters.

The method 700 begins by receiving a plurality of architecture parameters as shown in a block 710. This plurality of architecture parameters can be predetermined, adaptively determined, and/or provided using some other means). The method 700 then continues by selecting a first plurality of semi-soft design constraints based (at least in part) on the plurality of predetermined architecture parameters as shown in a block 720. It is noted that some examples of semi-soft design constraints can be found with reference to FIG. 13. In other words, based on the plurality of architecture parameters, the first plurality of semi-soft design constraints is then determined; some of the plurality of architecture parameters direct the vales of the plurality of semi-soft design constraints; others of the plurality of semi-soft design constraints may be determined independent of the plurality of architecture parameters in some embodiments.

The method 700 then continues by selecting a first parallel implementation of a plurality of processing modules employed within the ECC decoding architecture as shown in a block 730. In some embodiments, this first parallel implementation of the plurality of processing modules is a least parallel implementation of the plurality of processing modules. The plurality of processing modules can include a number of different processing modules including one or more arithmetic logic units (ALUs) which can be implemented (if desired) as Galois field ALUs, specifically designed mathematical processing modules such as dividers, and/or Chien search modules, etc.

The method 700 then continues by generating a first version of the ECC decoding architecture based on the first plurality of semi-soft design constraints and the first parallel implementation of a plurality of processing modules as shown in a block 740. The method 700 (or other methods performed in accordance with certain aspects of the invention) can involve generating multiple versions of the ECC decoding architecture, and one or more of the plurality of architecture parameters and/or the plurality of semi-soft design constraints can be modified during the design process to generate the multiple versions of the ECC decoding architecture.

The method 700 then continues by determining whether the first ECC decoding architecture meets a time constraint as shown in a decision block 750. This time constraint can be a time required by the ECC decoding architecture to perform correction of a maximum number of errors within a coded signal that is being decoded or to be decoded. Along the lines, some of the limiting factors to determine whether or not the ECC decoding architecture can perform correction of the maximum number of errors within the period of time include sector transfer time (e.g., the time needed to transfer a sector of data to or from the media of an HDD), a maximum transfer data rate (e.g., the maximum speed at which bits can transferred to or from the media of an HDD), the format of data (e.g., the size of preambles within the data), the relationships between various sub-system clocks (e.g., the relationships between the channel sub-clock which governs the rate at which data is transferred through the channel of an HDD, the sub-clock employed by the ECC sub-system within the device, and/or other sub-clocks within the device).

If it is determined that the first ECC decoding architecture meets the time constraint in the decision block 750, then the method 700 operates by employing the first version of the ECC decoding architecture to design at least a portion of a device that is operable to decode the coded signal. In some embodiments, the device is a communication device that is operable to communicate with other communication devices and/or communication networks. In other embodiments, the device is a device is a stand-alone device that does not perform communication with other devices.

Alternatively, if it is determined that the first ECC decoding architecture does not meet the time constraint in the decision block 750, then the method 700 operates by selecting a second plurality of semi-soft design constraints based on the plurality of predetermined architecture parameters as shown in a block 760. In this situation, the method 700 then continues by selecting a second parallel implementation of the plurality of processing modules employed within the ECC decoding architecture as shown in a block 770. The method 700 then continues by generating a second version of the ECC decoding architecture based on the second plurality of semi-soft design constraints and the second parallel implementation of the plurality of processing modules as shown in a block 780. The method 700 then continues by employing the second version of the ECC decoding architecture to design at least a portion of the device that is operable to decode the coded signal as shown in a block 790.

Figure 8:
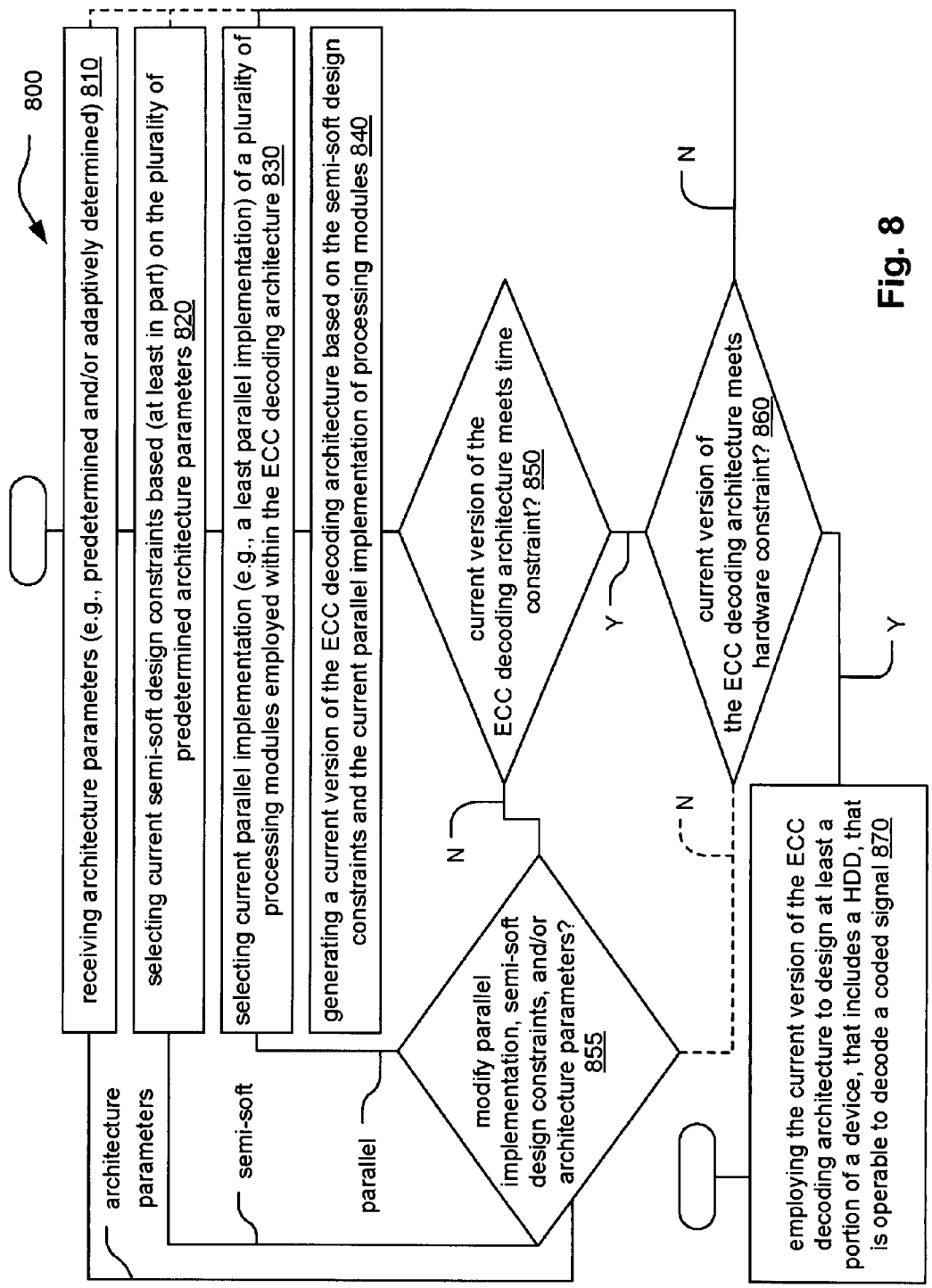
FIG. 8 illustrates an alternative embodiment of a method for designing an ECC decoding architecture using synthesis-time design parameters.

FIG. 8 illustrates an alternative embodiment of a method 800 for designing an ECC decoding architecture using synthesis-time design parameters.

The method 800 begins by receiving architecture parameters as shown in a block 810. Analogous to the previous embodiment, these architecture parameters can be predetermined, adaptively determined, and/or provided using some other means). The method 800 then continues by selecting current semi-soft design constraints based (at least in part) on the architecture parameters as shown in a block 820. In other words, based on the architecture parameters, the current semi-soft design constraints is then determined; some of the architecture parameters direct the current values of the semi-soft design constraints; others of the current values of the semi-soft design constraints may be determined independent of the architecture parameters in some embodiments.

The method 800 then continues by selecting a current parallel implementation of processing modules employed within the ECC decoding architecture as shown in a block 830. In some embodiments, this current implementation of the processing modules is a least parallel implementation of the processing modules. The processing modules can include a number of different processing modules including one or more arithmetic logic units (ALUs), specifically designed mathematical processing modules such as dividers, and/or Chien search modules, etc.

The method 800 then continues by generating a current version of the ECC decoding architecture based on the current semi-soft design constraints and the current parallel implementation of a processing modules as shown in a block 840. The method 800 (or other methods performed in accordance with certain aspects of the invention) can involves generating multiple versions of the ECC decoding architecture, and one or more of the architecture parameters, the semi-soft design constraints, and/or the parallel implementation of the processing modules can be modified during the design process to generate the multiple versions of the ECC decoding architecture. In other words, the current values of each of the one or more of the architecture parameters and/or the semi-soft design constraints can be modified during the design process. In some embodiments, the modification of the parallel implementation of the processing modules involves initially employing a least parallel implementation of the processing modules, then subsequently employing a second least parallel implementation of the processing modules, and so on until a sufficiently desired trade-off is found.

The method 800 then continues by determining whether the current version of the ECC decoding architecture meets a time constraint as shown in a decision block 850. As with a previous embodiment, this time constraint can be a time required by the ECC decoding architecture to perform correction of a maximum number of errors within a coded signal that is being or to be decoded.

If it is determined that the current version of the ECC decoding architecture meets the time constraint in the decision block 850, then the method 800 operates by determining of the current version of the ECC decoding architecture meets a hardware constraint as shown in a decision block 860. In some embodiments, this hardware constraint is power consumed by the device, a number of gates employed to implement the device in hardware, or some other hardware constraint.

If it is determined that the current version of the ECC decoding architecture meets a hardware constraint in the decision block 860, then the method 800 operates by employing the current version of the ECC decoding architecture to design at least a portion of a device that is operable to decode the coded signal as shown in a block 870. In some embodiments, as mentioned with respect to a previous embodiment, the device is a communication device that is operable to communicate with other communication devices and/or communication networks. In other embodiments, the device is a device is a stand-alone device that does not perform communication with other devices.

However, if it is determined that the current version of the ECC decoding architecture does not meet the time constraint in the decision block 850, then the method 800 operates by then determining whether to modify one, all or some combination thereof of the parallel implementation, the semi-soft design constraints, and/or the originally received architecture parameters as shown in a block 855. Based on which of these different considerations are modified, then the method 800 modifies them ultimately to generate a next version of the ECC decoding architecture.

Similarly, if it is determined that the current version of the ECC decoding architecture does not meet the hardware constraint in the decision block 860, then the method 800 operates by then determining whether to modify one, all or some combination thereof of the parallel implementation, the semi-soft design constraints, and/or the originally received architecture parameters. Based on which of these different considerations are modified, then the method 800 modifies them ultimately to generate a next version of the ECC decoding architecture. The method 800 then continues by performing this iterative design processing until the current version of the ECC decoding architecture meets both one or more time constraints and one or more hardware constraints. Then these are met, then the method 800 operates by employing the current version (e.g., the latest version) of the ECC decoding architecture to design at least a portion of a device that is operable to decode the coded signal as shown in a block 870.

Figure 9:
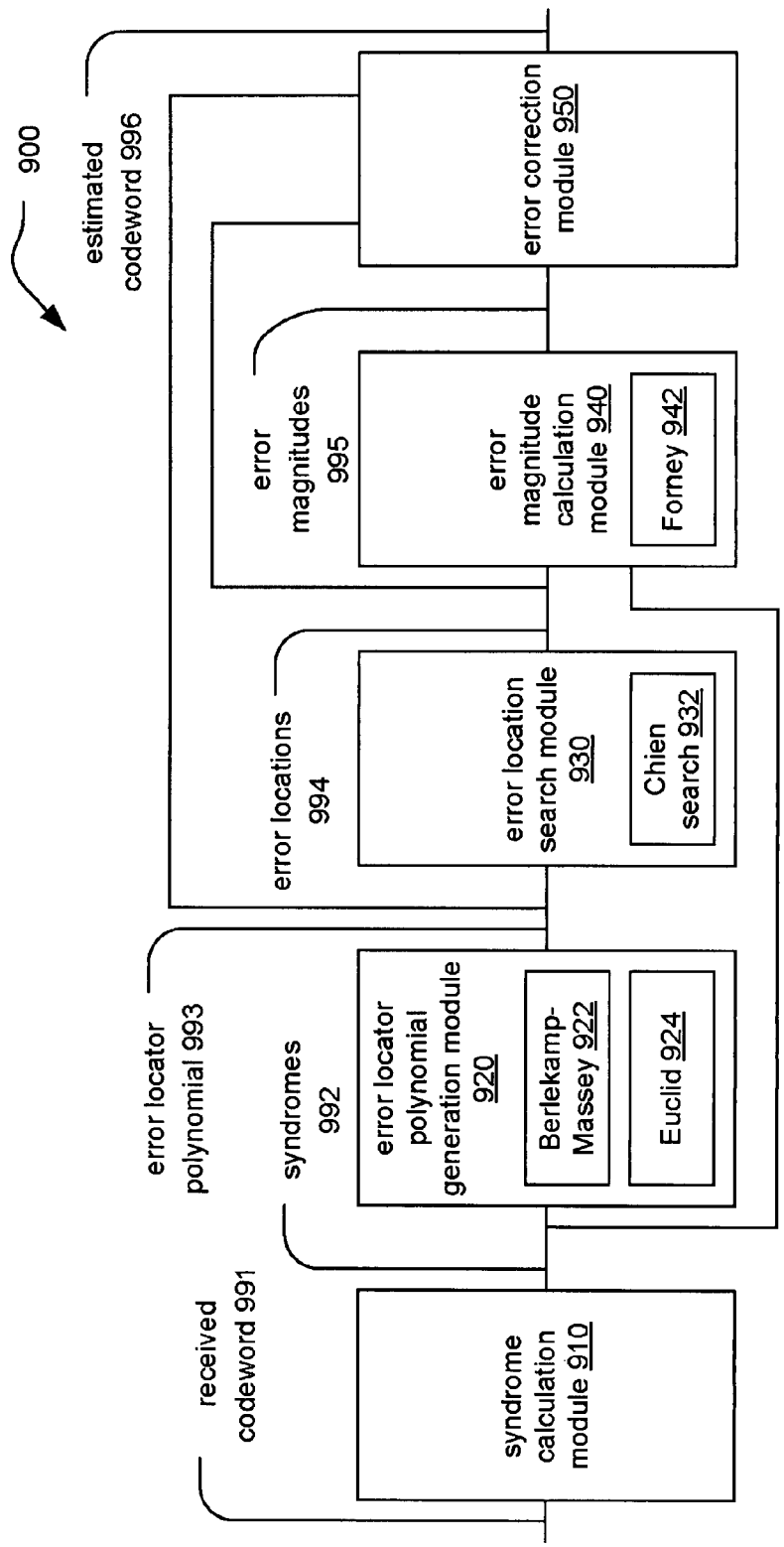
FIG. 9 illustrates an embodiment of a Reed-Solomon (RS) decoder.

FIG. 9 illustrates an embodiment of a Reed-Solomon (RS) decoder 900. The signals employed within some embodiments of ECC decoding architectures designed in accordance with certain aspects of the invention can be Reed-Solomon (RS) coded signals. Any of a very wide variety of applications that employ RS coding can benefit from various aspects of the invention, including any of those types of communication systems depicted in FIG. 4. Moreover, other types of devices and applications (e.g., including those employ some type of HDD) that employ RS coding can also benefit from various aspects of the invention.

Referring again to the RS decoder 900 of FIG. 9, this is a general depiction of an architecture of a RS decoder 900, and it is noted that variations and/or modifications thereof may be performed without departing from the scope and spirit of the invention. At a minimum, the RS decoder includes an error locator polynomial generation module 920 and an error location search module 930.

A corresponding RS encoder (not shown in this particular embodiment) takes data (e.g., a block of digital data) and adds redundancy or parity bits thereto thereby generating a codeword (e.g., a codeword to be written, transmitted, and/or launched into a communication channel). This redundancy is generated as a function of the particular RS code employed. Therefore, when the data (after undergoing RS encoding) is provided to some storage media (and/or transmitted via a communication channel and/or launched into a communication channel), and after it is read there from (or received there from), in the undesirable event that any errors occurred during either of these processes (write and/or read or transmit and/or receive), hopefully the number of errors incurred is less than the error correcting capability of the RS code. The number and types of errors that can be corrected depends on the particular characteristics of the RS code employed.

Looking at FIG. 9, a received codeword 991 can be viewed as being the originally transmitted (or written) codeword plus any errors that have been incurred during the write and/or read processes to the media or during the transmission and/or receipt of a RS coded signal. In addition, such as in the context of HDD applications, perhaps some defects occurred to the actual physical surface of the storage media after the codeword has been written. This received codeword would then also include those incurred errors as well. Generally speaking, the RS decoder 900 attempts to identify the locations and magnitudes of any errors within the received codeword 991 (up to the error correcting capability of the RS code) and to correct those errors.

A syndrome calculation module 910 then processes the received codeword 991 to generate syndromes 992. The operation of the syndrome calculation module 910 is analogous and similar to the calculation of the redundancy or parity bits within the RS encoding processing. As a function of the RS code employed, a RS codeword has a predetermined number of syndromes that depend only on errors (i.e., not on the actually written or transmitted codeword). The syndromes can be calculated by substituting a predetermined number of roots (as determined by the RS code) of the generator polynomial (employed within RS encoding) into the received codeword 991.

An error locator polynomial generation module 920 then receives these calculated syndromes 992. The syndromes 992 are also passed to an error magnitude calculation module 940. The error locator polynomial generation module 920 can generate the error locator polynomial 993 using various means, two of which can include the Berlekamp-Massey method 922 or Euclid method 924.

The error locator polynomial 993 is provided to an error correction module 950. The error locator polynomial 993 is also provided to an error location search module 930 that is operable to solve for the roots of the error locator polynomial 993. One approach is to employ the Chien search function 932.

Once the error locations 994 have been found within the error location search module 930 (i.e., using the Chien search function 932), then the error locations 994 are provided to the error magnitude calculation module 940 as well as to the error correction module 950. The error magnitude calculation module 940 finds the symbol error values, and it can employ a known approach such as the Forney method 942. Once the error locations 994 and the error magnitudes 995 are known, then the error correction module 950 corrects for them and outputs an estimated codeword 996.

With respect to the various processing modules depicted in this diagram as well as others, it is noted that any such processing module may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. Any such processing module can also be coupled to a memory. Such a memory may be a single memory device or a plurality of memory devices. Such a memory device may be a read-only memory, random access memory, volatile memory, non-volatile memory, static memory, dynamic memory, flash memory, and/or any device that stores digital information. Note that when such a processing module implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry. The memory stores, and the processing module executes, operational instructions corresponding to at least some of the steps and/or functions illustrated herein. Alternatively, it is noted that such a processing module may include an embedded memory (or memories) that is operable to assist in the operations analogous to an external memory as described above.

Figure 10:
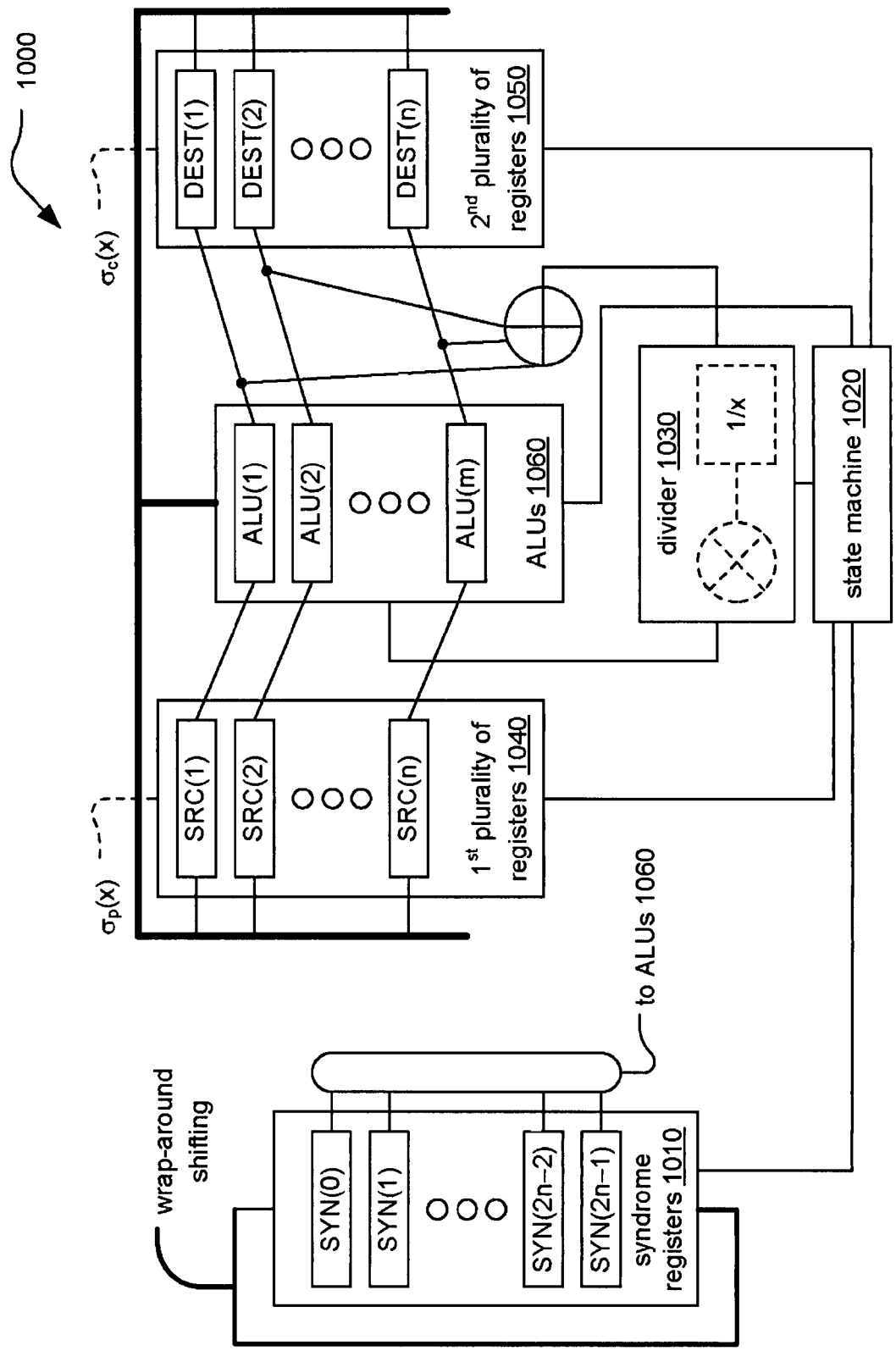
FIG. 10 illustrates an embodiment of a decoding architecture that employs Berlekamp-Massey decoding processing when decoding a RS coded signal.

FIG. 10 illustrates an embodiment of a decoding architecture 1000 that employs Berlekamp-Massey decoding processing 1000 when decoding a RS coded signal. With an architecture designed in accordance with this embodiment, the source (SRC) and destination (DEST) register banks may be reused during error value polynomial (EVP) computation and error location search operation (e.g., during the Chien search operation in accordance with RS decoding processing). As can also be seen, a first plurality of registers 1040 includes a number of registers as depicted by SRC(1), SRC(2), . . . , and a SRC(n). Polynomial multiplications by $X^{c-p}$ are accomplished by shifting the source (SRC) register bank as required. Similarly, a second plurality of registers 1050 includes a number of registers as depicted by DEST(1), DEST(2), and DEST(n). The first plurality of registers 1040 is operable to store the previous plurality of error location polynomial coefficients ($\sigma_p(x)$), and the second plurality of registers 1050 is operable to store the current plurality of error location polynomial coefficients ($\sigma_c(x)$). It is also noted that the error location polynomial is based the computed discrepancy which is based, in part, on the syndromes that correspond to a received codeword of the RS coded signal. These syndromes can be stored in a plurality of syndrome registers 1010 as depicted by SYN(0), SYN(1), . . . , SYN(2n−2), and SYN(2n−1). As can be seen in the diagram, selections of syndromes for discrepancy computations from the plurality of syndrome registers 1010 is performed by modifying the plurality of syndrome registers 1010 by wrap-around shifting; this obviates the need to perform multiplexing (e.g., resulting in the saving of gates) or some other form of modification of the plurality of syndrome registers 1010 to perform the appropriate selection of syndromes.

A plurality of arithmetic logic units (ALUs) 1060 as depicted by ALU(1), ALU(2), . . . , ALU(n) is operable to perform certain of the calculations required in performing both the error location polynomial generation and error value computation. One of the operations the plurality of ALUs 1060 performs is the calculation of the values of sigma ($\sigma$) (which is based on the values in the first plurality of registers 1040, the second plurality of registers 1050, and the discrepancy ratio); another one of the operations the plurality of ALUs 1060 performs is calculation of the discrepancy (which is based on the current sigma iteration and a selected set of syndromes). The discrepancy is generated using a summation of selected syndromes multiplied by corresponding sigma ($\sigma$) coefficients. It is noted that in the context of RS decoding, sigma ($\sigma$) corresponds to the error location polynomial.

While a plurality of ALUs 1060 is depicted here, it is noted that as few as a single ALU could be employed sequentially to perform the calculations for each of the corresponding registers. Alternatively, as many as one ALU could be employed for each to perform the calculations for each of the corresponding registers in a fully parallel implementation. Moreover, other number of ALUs can also be employed thereby giving a designer the ability to consider various cost performance trade-offs (e.g., various degrees of parallelism). The degree of parallelism of the ALUs 1060 is one of the many parameters that can be modified in designing an ECC decoding architecture in accordance with certain aspects of the invention.

When performing the division operations in accordance with generating the error location polynomial in accordance with RS decoding processing, a divider 1030 employs an inverter and a multiplier. This implementation of division is much cheaper than a single-cycle implemented divider in hardware. One of the reasons that such a divider 1030 (inverter and multiplier) can be employed herein because of the pipelined arrangement of the decoding processing. For example, the division processing can be afforded slightly more time herein when compared to prior art approaches. This allows for the use of multiple clock cycles to perform the inversion processing, and inversion is much cheaper to implement than a single-cycle implemented divider in hardware. A state machine 1020 is also employed to coordinate and govern the operations within the decoding processing.

As can be seen, the total number of registers required is slightly more than 4n, where n is the hardware correction power and $n \leq t$; it is noted that t is the ECC software correction power. It is noted that this diagram corresponds to the ECC decoder and does not include the symbol/syndrome computer module. When also including the symbol/syndrome computer module, then total number of registers required would be slightly more than 6n.

In accordance with certain embodiments of decoding of a RS coded signal, it may be required to compute the error value polynomial, which is also referred to as the error magnitude polynomial. If this is a requirement, the value in the DEST register bank (reference numeral 1050) may be moved into the SRC register bank (reference numeral 1040) so that the error value polynomial can be computed and stored in the DEST register bank. However, some implementations may not require generation of the error value polynomial at all.

The next step is to evaluate the error location polynomial in order to determine the locations of all errors (i.e., perform the error location search operations). This can be performed using a Chien search operation in some embodiments. As mentioned above, the error location search operations (e.g., the Chien search) can be performed using the existing SRC (first plurality of registers 1040) and DEST (second plurality of registers 1050) register banks. In one embodiment of a HDD application, it is noted that this re-using of the same register banks can be performed provided that an entire ECC correction can be completed within the worst-case sector transfer time.

Figure 11:
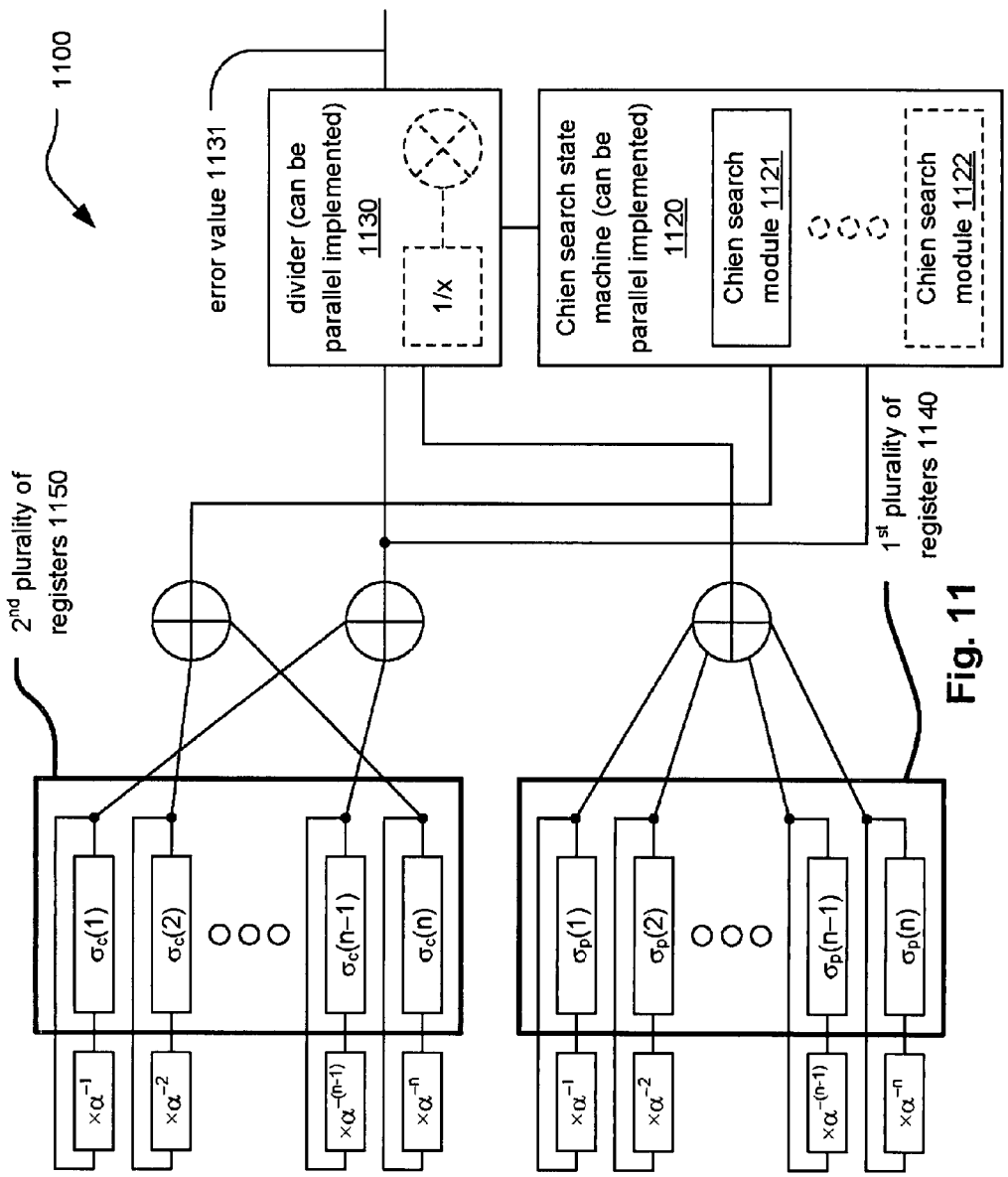
FIG. 11 illustrates an embodiment of error location searching and error magnitude (value) calculation in accordance with decoding of a RS coded signal.

FIG. 11 illustrates an embodiment of error location searching and error magnitude (value) calculation 1100 in accordance with decoding of a RS coded signal. This embodiment depicts one embodiment of a configuration of the hardware required for performing the error location search operations (e.g., the Chien search) as well as the error magnitude calculation operations (i.e., computing the error values). Analogous to the previous embodiment, it is noted that the division operations in accordance with performing the error value calculation can also employ a divider 1130 employs an inverter and a multiplier. It is noted that the divider 1130 can be the same divider 1030 of the previous embodiment; in other words, the divider 1030 can be reused for error value computation, if desired.

Again, such an implementation of division is much cheaper than a single-cycle implemented divider in hardware, and the pipelined arrangement of the decoding processing allows for the use of such a divider 1130 (inverter and multiplier, which can be implemented using a parallel embodiment that includes multiple divider modules that each include inverters and multipliers). In this embodiment, Chien searching is performed, and a Chien search state machine 1120 (which itself can be implemented using a degree of parallelism that includes more than one Chien search modules as depicted by Chien search module 1121, ... , and Chien search module 1122) is employed to coordinate and govern the operations of the error location search operation within the decoding processing.

The error location search operations employ a first plurality of registers 1140 and a second plurality of registers 1150 that are employed within the error location polynomial generation operations. The first plurality of registers 1140 is operable to store a first plurality of evaluated coefficients (e.g., a previous group) corresponding to each error location when processing the error location polynomial ($\sigma_p(x)$), shown as $\sigma_p(1)$, $\sigma_p(2)$, ... , $\sigma_p(n-1)$ and $\sigma_p(n)$. The second plurality of registers 1150 is operable to store a second plurality of evaluated coefficients corresponding to each error location when processing the error location polynomial (e.g., a current group) ($\sigma_c(x)$), shown as $\sigma_c(1)$, $\sigma_c(2)$, ... , $\sigma_c(n-1)$, and $\sigma_c(n)$.

The additional hardware required to perform a Chien search and compute error values (reference numeral 1131) includes constant ($\alpha$) multipliers (shown as $\times\alpha$), XOR trees and control logic. The divider and registers can be shared with the error location polynomial generation operations (e.g., the compute ELP function).

It is also noted with respect to this diagram that while ($\sigma_p(x)$) is shown within the first plurality of registers 1140, the actual values in these registers are the coefficients of some polynomial that is employed to compute error values at each error location.

Figure 12:
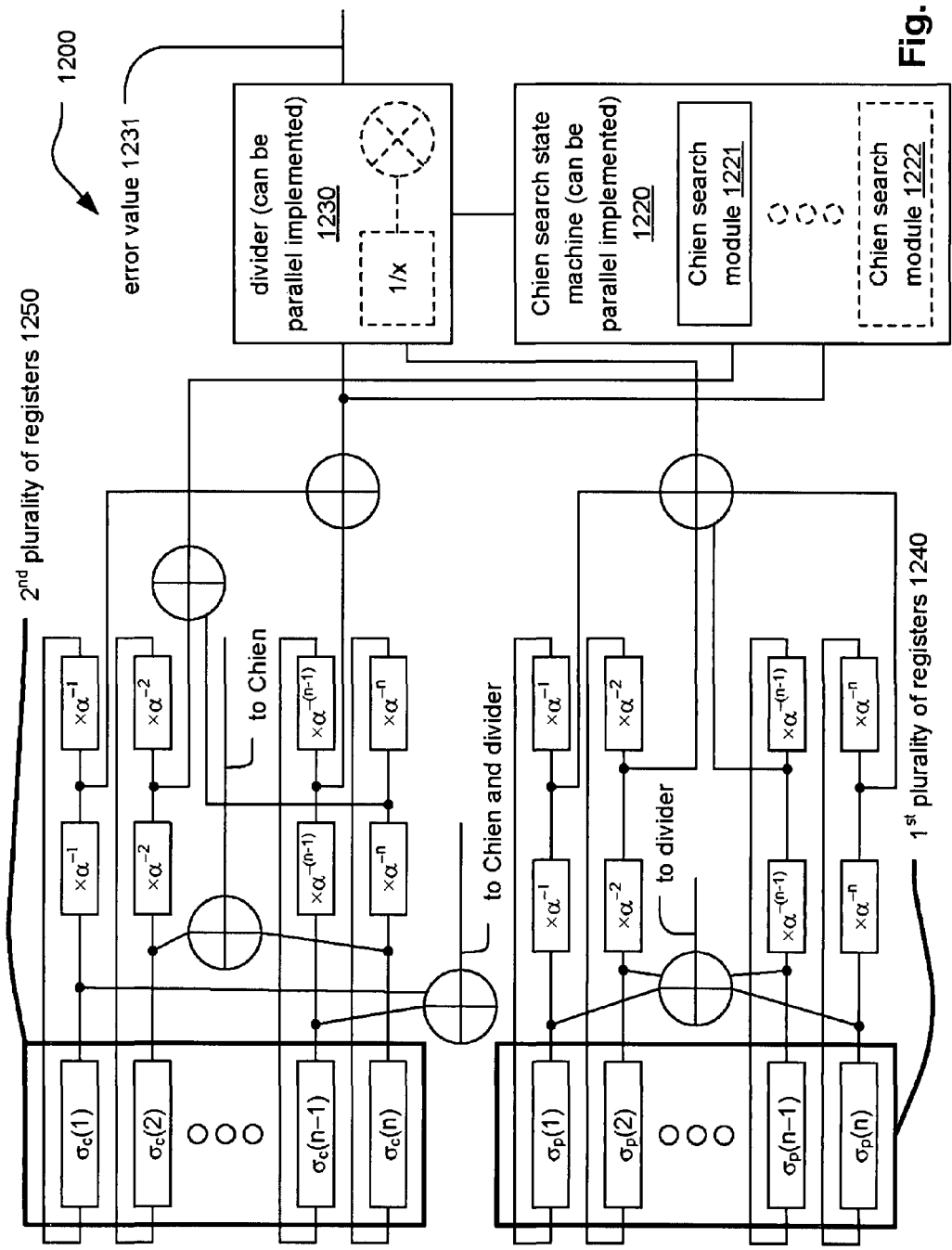
FIG. 12 illustrates an alternative embodiment of error location searching and error magnitude (value) calculation in accordance with decoding of a RS coded signal.

It is noted that various degrees of parallelism can be employed when doing error location searching (e.g., when doing Chien searching) in order to reduce evaluation time. Alternative to the embodiment shown in this diagram, multiple alpha (a) multipliers can be employed between the output of the registers and the input of the registers (e.g., multiple "$\times\alpha$" blocks could be employed instead of a singular "$\times\alpha$" block for each register). If this multiple alpha ($\alpha$) multipliers are employed, then access to each intermediate result (i.e., each result after each alpha ($\alpha$) multiplier) must be accessible for Chien searching evaluation. For example, multiple XOR trees would then operate on each intermediate result point (which shows 2 alpha ($\alpha$) multipliers implemented) to allow that point's evaluation in Chien searching as depicted in FIG. 12. Clearly, more than 2 alpha ($\alpha$) multipliers could also be employed without departing from the scope and spirit of the invention.

FIG. 12 illustrates an alternative embodiment of error location searching and error magnitude (value) calculation 1200 in accordance with decoding of a RS coded signal. This embodiment is analogous to the previous embodiment of FIG. 11, in that, a divider 1230 (which can be parallel implemented) and a Chien search state machine 1220 (which itself can be implemented using a degree of parallelism that includes more than one Chien search modules as depicted by Chien search module 1221, ... , and Chien search module 1222) is employed to coordinate and govern the operations of the error location search operation within the decoding processing. However, this embodiment also includes two "$\times\alpha$" blocks (e.g., 2 alpha ($\alpha$) multipliers) instead of a singular "$\times\alpha$" block for each register and different XOR trees that access the results from each of the "$\times\alpha$" blocks (e.g., alpha ($\alpha$) multipliers). Clearly, this degree of operating using multiple "$\times\alpha$" blocks (e.g., multiple alpha ($\alpha$) multipliers) can also be extended which would then necessitate more XOR trees. There may be a point where the trade-off of requiring more XOR trees is undesirable, and the current combination of the number of "$\times\alpha$" blocks (e.g., alpha (a) multipliers) and the number of XOR trees hits a sweet spot in the overall ECC decoding architecture.

Similarly, the trade-offs between various of the other design parameters may also arrive at a sweet spot, in that, the combination of those design parameters may be optimal for a particular design. The novel design approach presented herein allows a designer to arrive at such a sweet spot much quicker and much easier than using prior art design approaches.

Figure 13:
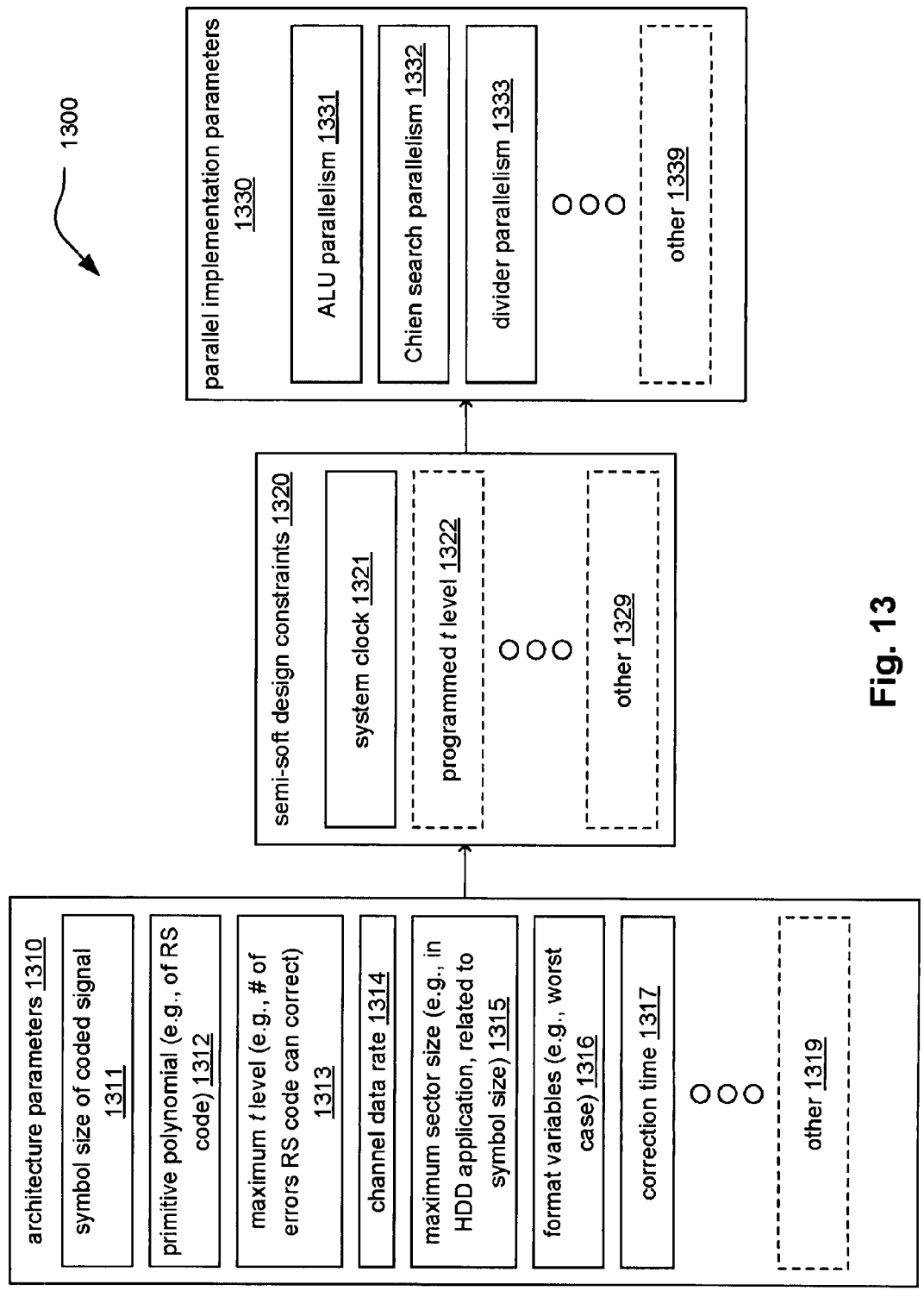
FIG. 13 illustrates an embodiment of some of the possible design considerations employed when designing an ECC decoding architecture using synthesis-time design parameters.

FIG. 13 illustrates an embodiment of some of the possible design considerations 1300 employed when designing an FCC decoding architecture using synthesis-time design parameters.

Some of the architecture parameters 1310 that can be employed include, but are not limited to, a symbol size of a coded signal to be decoded using the FCC decoding architecture as shown in a block 1311, a primitive polynomial 1312 (e.g., as employed within RS coding), a maximum t level (e.g., a number of errors a RS code can correct) as shown in a block 1313, a channel data rate 1314 (e.g., of a read channel as in a HDD application or a communication channel that couples a device that includes the FCC decoding architecture to at least one other device or communication network), a maximum sector size 1315 (e.g., as in a HDD application), format variables 1316 (e.g., as in a HDD application), correction time (e.g., the time required by the ECC decoding architecture to correct the maximum number of errors), and/or another architecture parameter as shown in a block 1319. It is noted that the maximum sector size 1315 is oftentimes related to the symbol size in HDD application.

Some of the semi-soft design constraints 1320 that can be employed include, but are not limited to, a system clock as shown in a block 1321 and the programmed t level (e.g., a number of errors a RS code can correct) as shown in the block 1322; the t level can be considered as either an architecture parameter or a semi-soft design constraint. Other semi-soft design constraints can also be employed as shown in a block 1329.

Some of the parallel implementation parameters 1330 that can be employed include, but are not limited to, the degree of parallelism employed by the ALUs as shown in a block 1331, the degree of parallelism employed by the Chien search modules (e.g., in a RS decoding architecture) as shown in a block 1332, the degree of parallelism employed by multiple dividers as shown in a block 1333, and/or parallel implementation parameter as shown in a block 1339. It is noted that the maximum sector size 1315 is oftentimes related to the symbol size in HDD application.

As stated above, many benefits are provided by this novel design approach. Though this list is not exhaustive, some of the benefits include area and power savings, a means that enables last-minute architectural modifications, as well as the ability to enable better ECC architectural decision making. In addition, it is noted that various end-result parameters (e.g., size or area, and power consumption) can be determined based on the various synthesis runs that have been performed. Moreover, a high degree of granularity can be provided with respect to how individual elements of the ECC decoding architecture affect these end-result parameters (e.g., size or area, and power consumption). Considering area, it can be determined how the number of registers employed correlates to the overall size or area of a device that includes the ECC decoding architecture. Also, depending on the parameters to be employed in various ECC decoding architecture designs, there may be instances where certain embodiments have larger area portions of certain components (e.g., combinatorial logic circuitry such as XOR decision trees). This high degree of granularity also can provide the relationship of how certain design parameters affect the size of the combinatorial logic circuitry, and how this in turn affects the area of the ECC decoding architecture.

Considering power consumption, some of the main contributors to this end-result parameter include the area of the ECC decoding architecture, the number of flops in the ECC decoding architecture, and the clock frequencies of each of the various sub-systems.

If only a few synthesis runs are performed, then modeling (e.g., curve fitting, extrapolation, interpolation, etc.) can be employed to model the correlation between how these individual elements of the ECC decoding architecture affect these end-result parameters. Clearly, the more synthesis runs that are performed, then the modeling can be even more accurate based on empirical data thereby modeling the correlation between how these individual elements of the ECC decoding architecture affect these end-result parameters.

This ability to correlate each of the design parameters (or a selected subset of the design parameters) to the end-result parameters (e.g., size or area, and power consumption) of the ECC decoding architecture allow a designer the ability to perform trade-offs between these various end-result parameters when arriving at a final ECC decoding architecture for a particular application.

It is also noted that there are many variations that can be employed in the design scaling parameters used herein. Also, while some of the embodiments presented herein correspond to RS coding, the principles presented herein can also be extended to designing other types of ECC coding architectures as well. When considering RS codes, other variations besides the RS decoding approach presented herein can also be employed without departing from the scope and spirit of the invention. Along those lines, there are possible variations in the ECC RS encoder/syndrome generator architecture that can also be employed as well. Moreover, there are variations in the analysis tool implementation which can also be employed.

It is also noted that the various modules (e.g., processing modules, encoding modules, decoding modules, etc.) described herein may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The operational instructions may be stored in a memory. The memory may be a single memory device or a plurality of memory devices. Such a memory device may be a read-only memory, random access memory, volatile memory, non-volatile memory, static memory, dynamic memory, flash memory, and/or any device that stores digital information. It is also noted that when the processing module implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry. In such an embodiment, a memory stores, and a processing module coupled thereto executes, operational instructions corresponding to at least some of the steps and/or functions illustrated and/or described herein.

The present invention has also been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention.

The present invention has been described above with the aid of functional building blocks illustrating the performance of certain significant functions. The boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention.

One of average skill in the art will also recognize that the functional building blocks, and other illustrative blocks, modules and components herein, can be implemented as illustrated or by discrete components, application specific integrated circuits, processors executing appropriate software and the like or any combination thereof.

Moreover, although described in detail for purposes of clarity and understanding by way of the aforementioned embodiments, the present invention is not limited to such embodiments. It will be obvious to one of average skill in the art that various changes and modifications may be practiced within the spirit and scope of the invention, as limited only by the scope of the appended claims.

What is claimed is:

1. A method for designing an error correction code (ECC) decoding architecture using synthesis-time design parameters, the method comprising:

receiving a plurality of predetermined architecture parameters;

selecting a first plurality of semi-soft design constraints based on the plurality of predetermined architecture parameters;

selecting a first parallel implementation of a plurality of processing modules employed within the ECC decoding architecture;

generating a first version of the ECC decoding architecture based on the first plurality of semi-soft design constraints and the first parallel implementation of a plurality of processing modules;

determining whether the first version of the ECC decoding architecture meets a time constraint;

if the first version of the ECC decoding architecture does not meet the time constraint, then:

selecting a second plurality of semi-soft design constraints based on the plurality of predetermined architecture parameters;

selecting a second parallel implementation of the plurality of processing modules employed within the ECC decoding architecture;

generating a second version of the ECC decoding architecture based on the second plurality of semi-soft design constraints and the second parallel implementation of the plurality of processing modules; and employing the second version of the ECC decoding architecture to design at least a portion of a communication device, that includes a hard disk drive (HDD), that is operable to decode a coded signal; and if the first version of the ECC decoding architecture meets the time constraint, then employing the first version of the ECC decoding architecture to design at least a portion of the communication device that is operable to decode the coded signal.

2. The method of claim 1, further comprising:

if the first version of the ECC decoding architecture meets the time constraint, then determining whether the first version of the ECC decoding architecture meets a hardware constraint;

if the first version of the ECC decoding architecture does not meet the hardware constraint, then:

selecting a third plurality of semi-soft design constraints based on the plurality of predetermined architecture parameters;

selecting a third parallel implementation of the plurality of processing modules employed within the ECC decoding architecture;

generating a third version of the ECC decoding architecture based on the plurality of semi-soft design constraints and the second parallel implementation of the plurality of processing modules; and employing the third version of the ECC decoding architecture to design at least a portion of the communication device that is operable to decode the coded signal; and when the first version of the ECC decoding architecture meets the time constraint and the hardware constraint, then employing the first version of the ECC decoding architecture to design at least a portion of the communication device that is operable to decode the coded signal.

3. The method of claim 1, wherein:

at least one version of the ECC decoding architecture is operable to correct an error within the coded signal within a period of time that is less than a sector time of the HDD.

4. The method of claim 1, wherein:

at least one version of the ECC decoding architecture is operable to correct a maximum number of errors within the coded signal;

the time constraint is a time required by at least one version of the ECC decoding architecture to perform correction of the maximum number of errors within the coded signal; and the hardware constraint is at least one of power and a number of gates per unit area.

5. The method of claim 1, wherein:

the second parallel implementation of the plurality of processing modules is more parallel than the first parallel implementation of the plurality of processing modules; and the first parallel implementation of a plurality of processing modules is a least parallel implementation of the plurality of processing modules.

6. The method of claim 1, wherein:

the plurality of processing modules includes at least one of an arithmetic logic unit (ALU) and a Chien search processing module.

7. The method of claim 1, wherein:

a semi-soft design constraint of the plurality of semi-soft design constraints is a system clock employed by the communication device.

8. The method of claim 1, wherein:

the coded signal is a RS coded signal that is generated using a RS (Reed-Solomon) code;

at least one version of the ECC decoding architecture is a RS decoding architecture; and a predetermined architecture parameter of the plurality of predetermined architecture parameters is one of a symbol size of the RS coded signal, a primitive polynomial of the RS code, a number of errors the RS decoding architecture can correct within the RS coded signal, and a channel data rate of a communication channel to which the communication device is or will be coupled.

9. A method for designing an error correction code (ECC) decoding architecture using synthesis-time design parameters, the method comprising:

receiving a plurality of predetermined architecture parameters;

selecting a first plurality of semi-soft design constraints based on the plurality of predetermined architecture parameters;

selecting a first parallel implementation of a plurality of processing modules;

generating a first version of the ECC decoding architecture based on the first plurality of semi-soft design constraints and the first parallel implementation of a plurality of processing modules;

determining whether the first version of the ECC decoding architecture meets a time constraint;

if the first version of the ECC decoding architecture does not meet the time constraint, then:

selecting a second plurality of semi-soft design constraints based on the plurality of predetermined architecture parameters;

selecting a second parallel implementation of the plurality of processing modules employed within the ECC decoding architecture;

generating a second version of the ECC decoding architecture based on the second plurality of semi-soft design constraints and the second parallel implementation of the plurality of processing modules; and determining whether the second version of the ECC decoding architecture meets the time constraint;

if the first version of the ECC decoding architecture meets the time constraint, then determining whether the first version of the ECC decoding architecture meets a hardware constraint;

if the first version of the ECC decoding architecture does not meet the hardware constraint, then:

selecting a third plurality of semi-soft design constraints based on the plurality of predetermined architecture parameters;

selecting a third parallel implementation of the plurality of processing modules employed within the ECC decoding architecture;

generating a third version of the ECC decoding architecture based on the plurality of semi-soft design constraints and the second parallel implementation of the plurality of processing modules; and determining whether the second version of the ECC decoding architecture meets the time constraint; and when a final version of the ECC decoding architecture, wherein the final version being the first version, the second version, the third version, or a subsequently generated version, meets the time constraint and the hardware constraint, then employing the final version of the ECC decoding architecture to design at least a portion of a communication device that is operable to decode a coded signal.

10. The method of claim 9, wherein:
the communication device includes a hard disk drive (HDD); and
the final version of the ECC decoding architecture is operable to correct an error within the coded signal within a period of time that is less than a sector time of the HDD.

11. The method of claim 9, wherein:
the final version of the ECC decoding architecture is operable to correct a maximum number of errors within the coded signal;
the time constraint is a time required by the final version of the ECC decoding architecture to perform correction of the maximum number of errors within the coded signal; and
the hardware constraint is at least one of power and a number of gates per unit area.

12. The method of claim 9, wherein:
the second parallel implementation of the plurality of processing modules is more parallel than the first parallel implementation of the plurality of processing modules; and
the first parallel implementation of a plurality of processing modules is a least parallel implementation of the plurality of processing modules.

13. The method of claim 9, wherein:
the plurality of processing modules includes at least one of an arithmetic logic unit (ALU) and a Chien search processing module.

14. The method of claim 9, wherein:
a semi-soft design constraint of the plurality of semi-soft design constraints is a system clock employed by the communication device.

15. The method of claim 9, wherein:
the coded signal is a RS coded signal that is generated using a RS (Reed-Solomon) code;
final version of the ECC decoding architecture is a RS decoding architecture; and
a predetermined architecture parameter of the plurality of predetermined architecture parameters is one of a symbol size of the RS coded signal, a primitive polynomial of the RS code, a number of errors the RS decoding architecture can correct within the RS coded signal, and a channel data rate of a communication channel to which the communication device is or will be coupled.

16. The method of claim 9, wherein:
the coded signal is a RS coded signal that is generated using a RS (Reed-Solomon) code;
the final version of the ECC decoding architecture is a RS decoding architecture;
the communication device includes a hard disk drive (HDD); and
a predetermined architecture parameter of the plurality of predetermined architecture parameters is one of maximum sector size of the HDD and a format variable of the HDD.

17. An apparatus that is operable to design an error correction code (ECC) decoding architecture using synthesis-time design parameters, the apparatus comprising:
a processing module; and
a memory, coupled to the processing module, that is operable to store operational instructions that enable the processing module to:
receive a plurality of predetermined architecture parameters;
select a first plurality of semi-soft design constraints based on the plurality of predetermined architecture parameters;
select a first parallel implementation of a plurality of processing modules employed within the ECC decoding architecture, wherein the plurality of processing modules includes at least one of an arithmetic logic units (ALU) and a Chien search processing module;
generate a first version of the ECC decoding architecture based on the first plurality of semi-soft design constraints and the first parallel implementation of a plurality of processing modules;
determine whether the first version of the ECC decoding architecture meets a time constraint;
if the first version of the ECC decoding architecture does not meet the time constraint, then:
  select a second plurality of semi-soft design constraints based on the plurality of predetermined architecture parameters;
  select a second parallel implementation of the plurality of processing modules employed within the ECC decoding architecture;
  generate a second version of the ECC decoding architecture based on the second plurality of semi-soft design constraints and the second parallel implementation of the plurality of processing modules; and
  select the second version of the ECC decoding architecture to be implemented as at least a portion of a communication device, that includes a hard disk drive (HDD), that is operable to decode a coded signal; and
if the first version of the ECC decoding architecture meets the time constraint, then select the first version of the ECC decoding architecture to be implemented as at least a portion of the communication device that is operable to decode the coded signal.

18. The apparatus of claim 17, wherein the memory, coupled to the processing module, is operable to store operational instructions that enable the processing module to:
if the first version of the ECC decoding architecture meets the time constraint, then determine whether the first version of the ECC decoding architecture meets a hardware constraint;
if the first version of the ECC decoding architecture does not meet the hardware constraint, then:
  select a third plurality of semi-soft design constraints based on the plurality of predetermined architecture parameters;
  select a third parallel implementation of the plurality of processing modules employed within the ECC decoding architecture;
  generate a third version of the ECC decoding architecture based on the plurality of semi-soft design constraints and the second parallel implementation of the plurality of processing modules; and
  select the third version of the ECC decoding architecture to be implemented as at least a portion of the communication device that is operable to decode the coded signal; and when the first version of the ECC decoding architecture meets the time constraint and the hardware constraint, then select the first version of the ECC decoding architecture to be implemented as at least a portion of the communication device that is operable to decode the coded signal.

19. The apparatus of claim 18, wherein:

the coded signal is a RS coded signal that is generated using a RS (Reed-Solomon) code;

at least one version of the ECC decoding architecture is a RS decoding architecture; and a predetermined architecture parameter of the plurality of predetermined architecture parameters is one of a symbol size of the RS coded signal, a primitive polynomial of the RS code, a number of errors the RS decoding architecture can correct within the RS coded signal, and a channel data rate of a communication channel to which the communication device is or will be coupled.

20. The apparatus of claim 18, wherein:

at least one version of the ECC decoding architecture is operable to correct a maximum number of errors within the coded signal;

the time constraint is a time required by at least one version of the ECC decoding architecture to perform correction of the maximum number of errors within the coded signal;

the hardware constraint is at least one of power and a number of gates per unit area; and a semi-soft design constraint of the plurality of semi-soft design constraints is a system clock employed by the communication device.

* * * * *